(12) United States Patent
Vermang (10) Patent No.: US 8,557,718 B2
(45) Date of Patent: Oct. 15, 2013

(54) METHOD FOR BLISTER-FREE PASSIVATION OF A SILICON SURFACE

(75) Inventor: Bart Vermang, Leuven (BE)

(73) Assignees: IMEC, Leuven (BE); Katholieke Universiteit Leuven, Leuven (BE)

(*) Notice: Subject to any disclaimer, the term of this patent is extended or adjusted under 35 U.S.C. 154(b) by 0 days.

(21) Appl. No.: 13/489,305

(22) Filed: Jun. 5, 2012

(65) Prior Publication Data

US 2012/0306058 A1 Dec. 6, 2012

Related U.S. Application Data

(60) Provisional application No. 61/493,920, filed on Jun. 6, 2011.

(51) Int. Cl.
*H01L 21/31* (2006.01)

(52) U.S. Cl.
USPC ............. 438/778; 438/3; 438/53; 438/98; 438/455; 438/458; 257/E21.214

(58) Field of Classification Search
None
See application file for complete search history.

(56) References Cited

U.S. PATENT DOCUMENTS

2012/0192943 A1* 8/2012 Vermang et al. ............. 136/256

OTHER PUBLICATIONS

A. Richter et al., "Firing stable $Al_2O_3/SiN_x$ layer stack passivation for the front side boron emitter of n-type silicon solar cells", 25th EPVSEC, Sep. 2010, Valencia, Spain.

* cited by examiner

*Primary Examiner* — Kyoung Lee
(74) *Attorney, Agent, or Firm* — Knobbe, Martens, Olson & Bear LLP (57) ABSTRACT

A method of forming a surface passivation layer on a surface of a crystalline silicon substrate is disclosed. In one aspect, the method includes depositing an $Al_2O_3$ layer on the surface, the $Al_2O_3$ layer having a thickness not exceeding about 15 nm; performing an outgassing process at a temperature in the range between about 500° C. and 900° C., after the deposition of the $Al_2O_3$ layer on the surface; and after the outgassing process, depositing at least one additional dielectric layer such as a silicon nitride layer and/or a silicon oxide layer on the $Al_2O_3$ layer.

17 Claims, 13 Drawing Sheets

| texturing/polishing |
| --- |
| T = 20°C - 90°C, t ~ 1 hour |

| cleaning |
| --- |
| T = 20°C - 90°C, t ~ 10 min |

| $POCl_3$ diffusion |
| --- |
| T = 800°C - 950°C, t ~ 1 hour |

| rear emitter removal |
| --- |
| T = 20°C - 90°C, t ~ 5 min |

| front PSG removal |
| --- |
| T = 20°C - 25°C, t ~ 1 min |

| cleaning |
| --- |
| T = 20°C - 90°C, t ~ 10 min |

| rear passivation stack |
| --- |
| T = 150°C - 450°C, t ~ 10 min |

| $SiN_x$ ARC |
| --- |
| T = 150°C - 450°C, t ~ 4 min |

| rear local opening |
| --- |
| T = 20°C - 25°C, t ~ 1 min |

| metallization |
| --- |
| T = 50°C - 200°C, t ~ 10 min |

| co-firing |
| --- |
| T = 600°C - 1000°C, t ~ 1 min |

METHOD FOR BLISTER-FREE PASSIVATION OF A SILICON SURFACE

CROSS REFERENCE TO RELATED APPLICATIONS

This application claims priority under 35 U.S.C. §119(e) to U.S. provisional patent application 61/493,920 filed on Jun. 6, 2011, which application is hereby incorporated by reference in its entirety.

BACKGROUND OF THE INVENTION

1. Field of the Invention

The disclosed technology relates to methods for blister-free passivation of a silicon surface, which may be used for surface passivation of silicon photovoltaic cells.

2. Description of the Related Technology

The silicon photovoltaic industry uses ever thinner wafers to significantly reduce the silicon content per wafer, thereby reducing the cost of photovoltaic cells. Consequently the surface-to-volume ratio of the cells increases, and therefore the need for providing a good surface passivation of bulk silicon photovoltaic cells gains importance.

Because of the high sensitivity of the silicon bulk lifetime to high temperature processes, especially for multi-crystalline silicon wafers, low-temperature surface passivation processes are being developed for future industrial high-efficiency silicon photovoltaic cells. For example, it has been shown that thin films of aluminum oxide ($Al_2O_3$) grown by atomic layer deposition (ALD) can provide a good surface passivation on p-type and n-type silicon wafers. On p-type crystalline silicon surfaces, a fixed negative charge density within the $Al_2O_3$ layer can induce an accumulation layer that provides an effective field-effect passivation. Therefore, ALD-deposited $Al_2O_3$ can advantageously be used for p-type rear surface passivation of photovoltaic cells, such as for example for PERC-type (passivated emitter and rear contacts) photovoltaic cells and for PERL-type (passivated emitter rear locally diffused) photovoltaic cells. On top of the ALD-deposited $Al_2O_3$ layer an additional dielectric layer, such as a silicon nitride layer or a silicon oxide layer can be provided.

In photovoltaic cell fabrication processes, after depositing the $Al_2O_3$ passivation layer, often an annealing at high temperature is performed, such as for example a metal firing. For example, in a fabrication process for PERC-type silicon photovoltaic cells, a co-firing process at a temperature above 835° C. is typically done. When using at the rear side of such a cell an $Al_2O_3$ passivation layer or a stack comprising an $Al_2O_3$ layer and a dielectric layer such as a silicon nitride layer, it is known that such high temperature annealing processes often lead to blistering of the passivation layer, i.e. partial delamination of the $Al_2O_3$ layer and formation of bubbles or blisters at the interface between the passivation layer and the silicon surface. Such blisters have a negative effect on the passivation quality of the passivation layer, leading to a reduced open-circuit-voltage $V_{oc}$ and thus a reduced energy conversion efficiency of the photovoltaic cell.

For example, in "Firing stable $Al_2O_3$/$SiN_x$ layer stack passivation for the front side boron emitter of n-type silicon solar cells", 25$^{th}$ EPVSEC, September 2010, Valencia, Spain, A. Richter et al report blistering effects in an $Al_2O_3$/$SiN_x$ stack after firing at high temperature (750° C. to 850° C.). It was found that blistering is significantly affected by the $Al_2O_3$ layer thickness and deposition temperature. More in particular, stronger blistering is observed with an increasing layer thickness and for a decreasing deposition temperature.

SUMMARY OF CERTAIN INVENTIVE ASPECTS

Certain inventive aspects relate to a method for forming a good surface passivation layer on a silicon surface, the surface passivation layer comprising an $Al_2O_3$ layer, wherein a good surface passivation quality of the passivation layer is maintained and wherein blister formation is avoided even after further treatments at elevated temperatures, e.g., at temperatures in the range between about 400° C. and 900° C., or between about 500° C. and 900° C.

One inventive aspect relates to a method for forming a good surface passivation layer on a surface of a crystalline silicon substrate, the method comprising: depositing an $Al_2O_3$ layer on the surface, the $Al_2O_3$ layer having a thickness between about 1 and 15 nm, more particularly between about 1 and 10 nm, more particularly not exceeding about 15 nm, not exceeding about 10 nm, or not exceeding 15 nm, or not exceeding 10 nm, or not exceeding 9 nm, 8 nm, 7 nm, 6 nm, 5 nm; performing an outgas sing process at a temperature in the range between, or between about, 500° C. and 900° C., more particularly in the range between about 500° C. and 850° C., more particularly in the range between about 700° C. and 850° C.; and after the outgassing process, depositing at least one additional dielectric layer such as a silicon nitride layer and/or a silicon oxide layer on the $Al_2O_3$ layer. The duration of the out-gassing process can be for instance between about 5 and 30 minutes. For instance it can be about 10, or about 15, or about 20, or about 25 minutes.

The $Al_2O_3$ layer can be deposited by atomic layer deposition (ALD), particularly at a temperature in the range between, or between about, 150° C. and 250° C., or by plasma enhanced chemical vapor deposition (PECVD), particularly at a temperature in the range between, or between about, 150° C. and 350° C., or by any suitable method known by a person skilled in the art. The outgassing process can for example be performed in a nitrogen environment.

It is an advantage of a method according to one inventive aspect that it leads to $Al_2O_3$ surface passivation layers and $Al_2O_3$/dielectric layer stacks with a good surface passivation quality, wherein the surface passivation quality is maintained and wherein blister formation is avoided even after further processing performed at high temperatures.

According to one aspect, the method further comprises cleaning the surface before depositing the $Al_2O_3$ layer on the surface, by means of a cleaning method leading to a hydrophilic surface.

According to one aspect, the method further comprises any suitable selection or combination of the following: texturing/polishing of a front surface/rear surface of the silicon substrate; emitter diffusion, e.g. $POCl_3$ diffusion, on the front and/or back surface of the substrate; rear side emitter removal; depositing a $SiN_x$ antireflection coating on the front surface; providing contact openings to the back surface through the passivation stack on the rear surface, for instance by laser ablation; physical vapor deposition of a metal, e.g. Al on the rear surface and screen-printing of a metal e.g. Ag front on the front surface; and co-firing front and back contacts.

The method according to one inventive aspect can advantageously be used for the rear surface passivation of silicon photovoltaic cells, such as PERC-type or PERL-type cells, wherein a metal firing process is performed after forming the $Al_2O_3$ surface passivation layer and after capping the surface passivation layer with an additional dielectric layer, the additional dielectric layer forming a barrier against metal spiking during firing and improving back reflectance. The metal firing process can for instance be performed at a temperature higher than about 835° C.

When using a method according to one inventive aspect, it is avoided that such metal firing process leads to a significant deterioration of the surface passivation quality. More in particular, the partial delamination of the passivation layer and the formation of blisters at an interface between the silicon substrate and the surface passivation layer are avoided.

Certain objects and advantages of various inventive aspects have been described herein above. Of course, it is to be understood that not necessarily all such objects or advantages may be achieved in accordance with any particular embodiment. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

BRIEF DESCRIPTION OF THE DRAWINGS

FIG. 2 shows temperature programmed desorption (TDS) data measured by APIMS at: FIG. 2(a) m/e=18 ($H_2O^+$) and 29 ($N_2H^+$), and FIG. 2(b) m/e=15-70 and 71-100. Spectra are displayed for a Si sample with 30 nm $Al_2O_3$ deposited at 200° C. and for a dummy wafer (background).

In the different drawings, the same reference signs refer to the same or analogous elements.

DETAILED DESCRIPTION OF CERTAIN ILLUSTRATIVE EMBODIMENTS

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

Furthermore, the terms first, second, third and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the context of the present description, the front surface or front side of a photovoltaic cell or of a substrate is the surface or side adapted for being oriented towards a light source and thus for receiving illumination. The back surface, rear surface, back side or rear side of a photovoltaic cell or of a substrate is the surface or side opposite to the front surface or side.

One embodiment relates to a method for forming a good, blister-free, surface passivation layer on a surface of a silicon substrate, the method comprising: depositing an $Al_2O_3$ layer on the surface, the $Al_2O_3$ layer having a thickness not exceeding about 10 nm, e.g. in the range between about 1 nm or 2 nm and 10 nm; performing an outgassing process at a temperature in the range between about 500° C. and 850° C.; and, after the outgassing process, depositing at least one additional dielectric layer such as a silicon nitride layer or a silicon oxide layer on the $Al_2O_3$ layer.

It is an advantage of a method according to one embodiment that it leads to surface passivation layers with a good surface passivation quality that is maintained even after further processing performed at high temperatures. In one embodiment, before capping the $Al_2O_3$ layer with any additional layer, an outgas sing process is performed. The $Al_2O_3$ layer is made sufficiently thin such that it doesn't form a barrier for the gases, i.e. such that gasses can diffuse through the thin $Al_2O_3$ layer, thus avoiding blister formation during outgassing. As gases are released before capping the $Al_2O_3$ layer with any other layer, also blister formation in a later stage of the process, e.g. under the influence of further high-temperature processes after capping of the $Al_2O_3$ layer, is avoided.

In one embodiment, the method may be used for the rear surface passivation of silicon photovoltaic cells, such as PERC-type or PERL-type cells, wherein a metal firing process is performed after forming the surface passivation layer. When using a method according to one embodiment, it is avoided that such metal firing process leads to a significant deterioration of the surface passivation quality. More in particular, the partial delamination of the $Al_2O_3$ passivation layer and the formation of blisters at an interface between the silicon substrate and the $Al_2O_3$ surface passivation layer is avoided.

Figure 1:
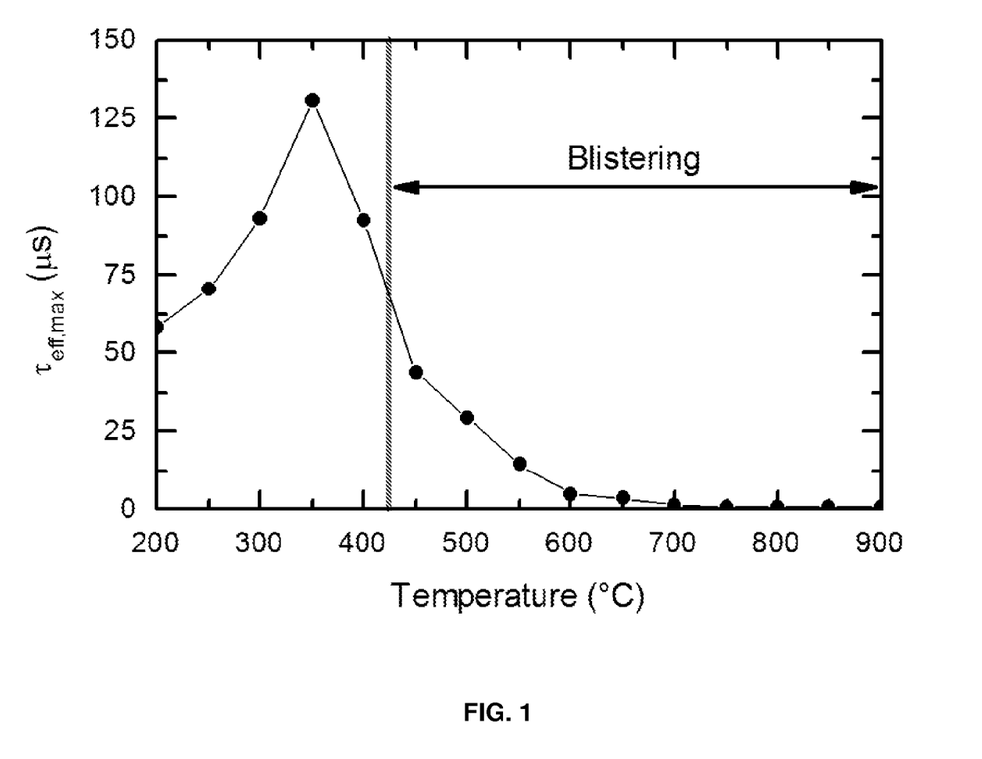
FIG. 1 shows maximum effective lifetimes measured by QSSPC (quasi-steady-state photo conductance) on 0.4 Ω·cm p-type FZ c-Si wafers, passivated with 30 nm of ALD $Al_2O_3$ deposited at 200° C. and annealed in forming gas for 30 minutes, as a function of the annealing temperature.

Experiments were performed wherein 30 nm thick $Al_2O_3$ layers were deposited by thermal ALD at 200° C. on 0.4 Ohm-cm p-type FZ silicon wafers. After $Al_2O_3$ deposition a forming gas annealing process was performed for 30 minutes, at different annealing temperatures in the range between about 200° C. and 900° C. FIG. 1 shows the maximum effective minority carrier lifetimes as measured by quasi steady state photo conductance (QSSPC) as a function of the annealing temperature. In one embodiment, the highest effective lifetimes were obtained for annealing temperatures in the range between about 350° C. and 400° C. For annealing temperatures above about 400° C., the effective lifetime decreases. It was observed that at these higher annealing temperatures blisters appear, and that for increasing annealing temperature the size of the blisters increases. For example, annealing at 400° C. leads to blisters with a radius in the order of 1 micrometer; annealing at 430° C. results in blisters with a radius in the order of 2 micrometer; after annealing at 470° C. a blister radius in the order of 3 micrometer was measured, and after annealing at 500° C. the blister radius was in the order of 3.5 micrometer.

Figure 2A:
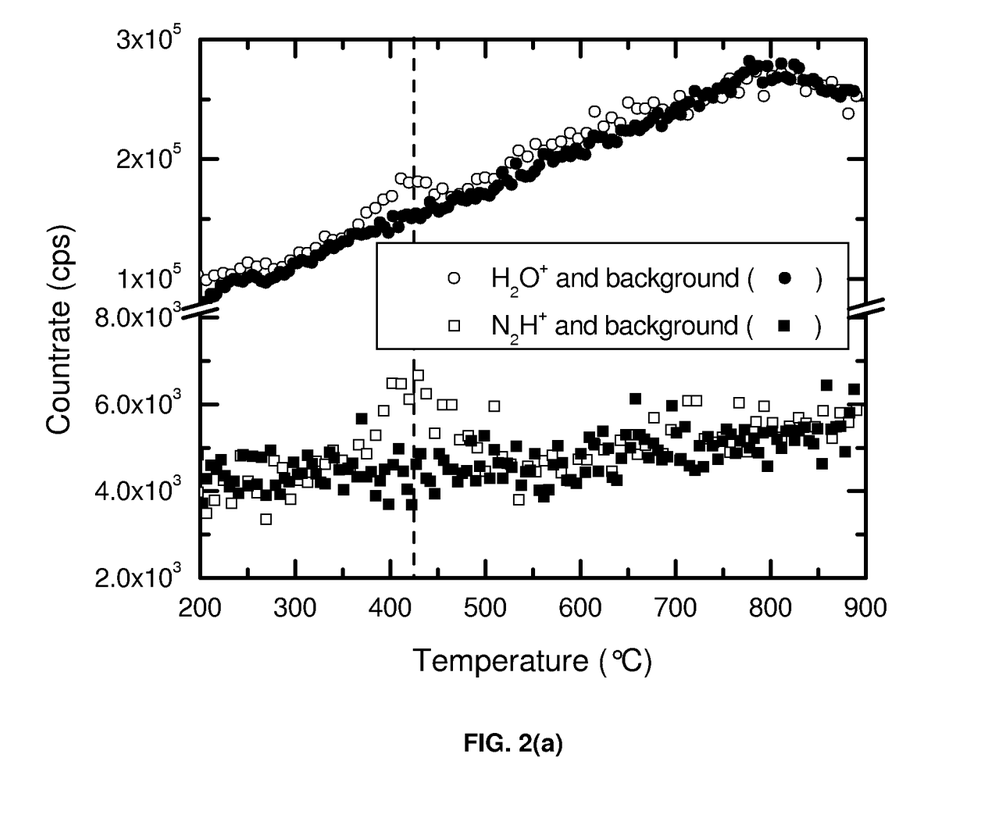
Figure 2B:
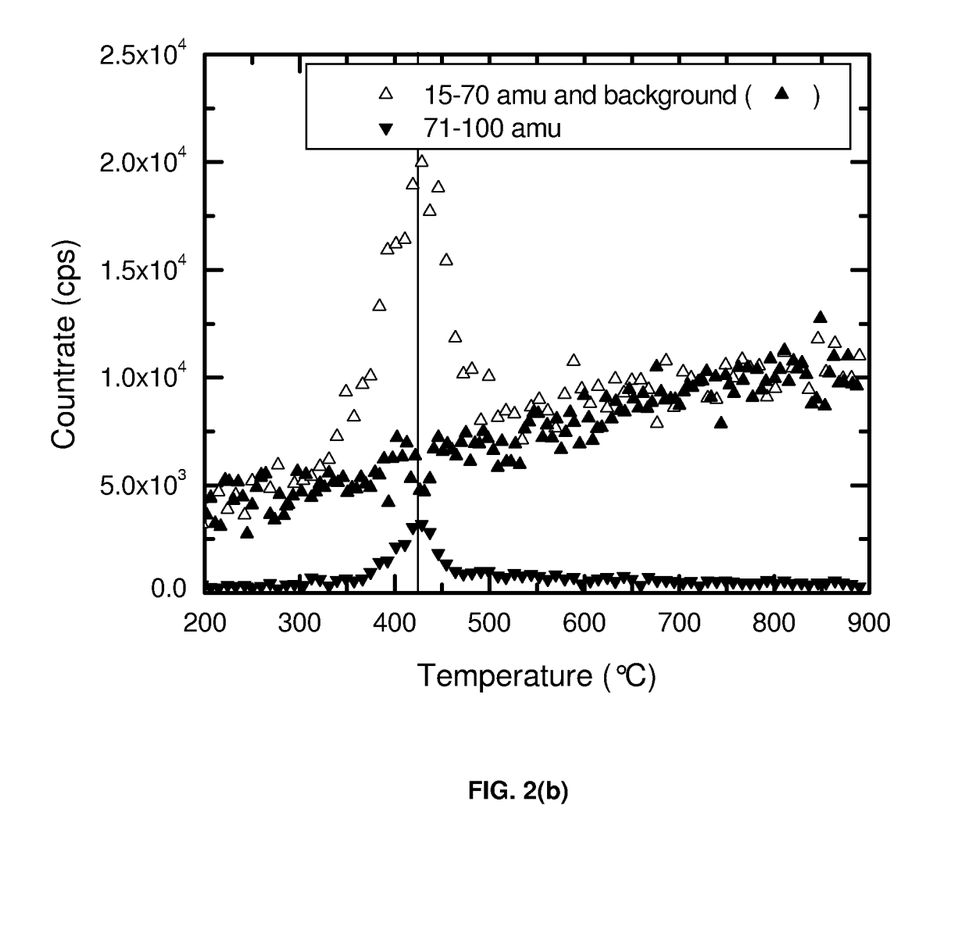

Using an atmospheric pressure rapid thermal processing (RTP) chamber with atmospheric pressure ionization mass spectrometry (APIMS), desorbing species upon heating the $Si/Al_2O_3$ samples were identified. FIG. 2(a) shows desorption spectra for m/e (mass to charge ratio)=18 ($H_2O^+$) and 29 ($N_2H^+$), an indication of desorption of $H_2O$ and $H_2$, respectively. FIG. 2(b) shows (i) spectra from m/e=15 to 70, except those related to $N_2$, $H_2O$, $O_2$ and $CO_2$ (hence, m/e=17-19, 28-29, 32, 35-37, 41-42, 44, 46, 50, 55-57, 60 are eliminated), where interferences are too large, and (ii) all spectra from m/e=71 to 100. Spectra are displayed for a Si sample with 30 nm $Al_2O_3$ deposited at 200° C. and for a dummy wafer (background). From the measurements shown in FIG. 2(a) and FIG. 2(b) it can be concluded that desorption peaks can be observed immediately above 400° C. for all spectra.

Based on these observations, it can be concluded that the formation of blisters at the $Si/Al_2O_3$ interface upon heating at temperatures above about 400° C. (FIG. 1) may be related to gaseous desorption at such temperatures (FIG. 2).

Figure 3:
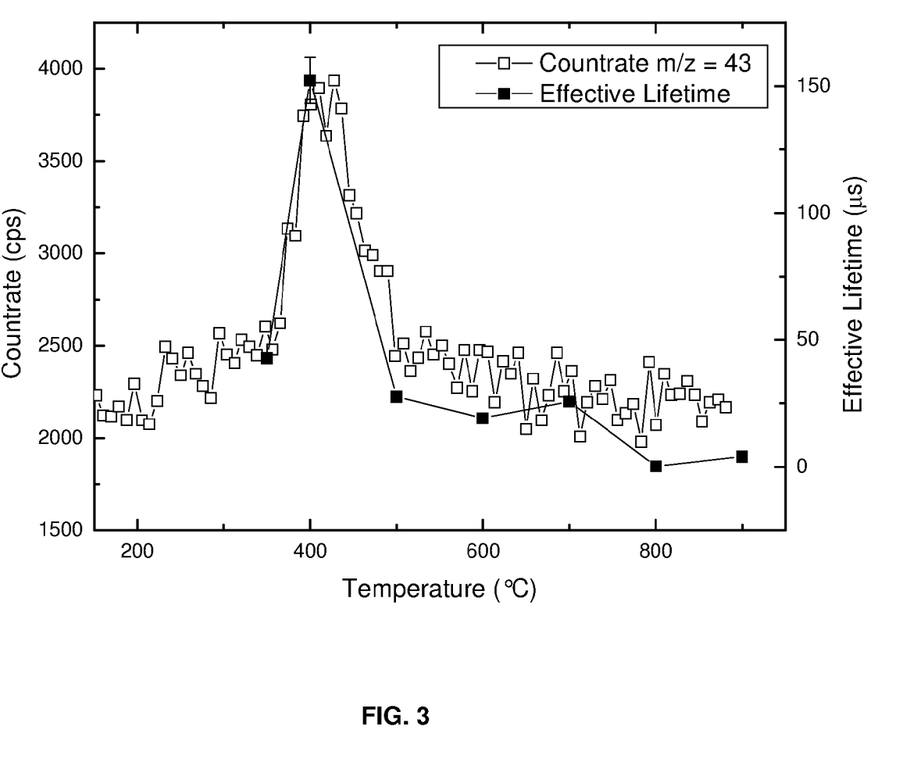
FIG. 3 shows temperature programmed desorption (TDS) data measured by APIMS at m/z=43 (open squares) and effective lifetimes (filled squares) for a Si sample with 30 nm $Al_2O_3$ deposited at 200° C. as a function of annealing temperature.

ALD $Al_2O_3$ layers with a thickness of 30 nm were deposited on a silicon wafer at a deposition temperature of 200° C. After $Al_2O_3$ deposition the wafer was heated to a temperature (continuously increasing temperature) ranging from 180° C. to 900° C. FIG. 3 shows the measured desorption spectrum (open squares) for m/z (atomic mass unit)=43, which may be an indication for $H_2O$. It can be seen that outgassing mainly starts from a temperature of about 400° C. It was observed that also blistering starts at an annealing temperature of about 400° C. or more. FIG. 3 also shows the measured effective lifetime (full squares) for different samples that were annealed at different temperatures. A strong correlation with the outgas sing profile was found, with the highest effective lifetime for annealing at a temperature of about 400° C. and a steeply decreasing lifetime for higher annealing temperatures, going to effective lifetimes close to zero for annealing temperatures higher than about 700° C. These results indicate that a 30 nm thick $Al_2O_3$ layer forms a barrier for gas desorption, leading to blister formation when an annealing process is done at temperatures higher than about 400° C. A similar trend was observed for other $Al_2O_3$ layers thicker than about 15 nm.

Figure 4:
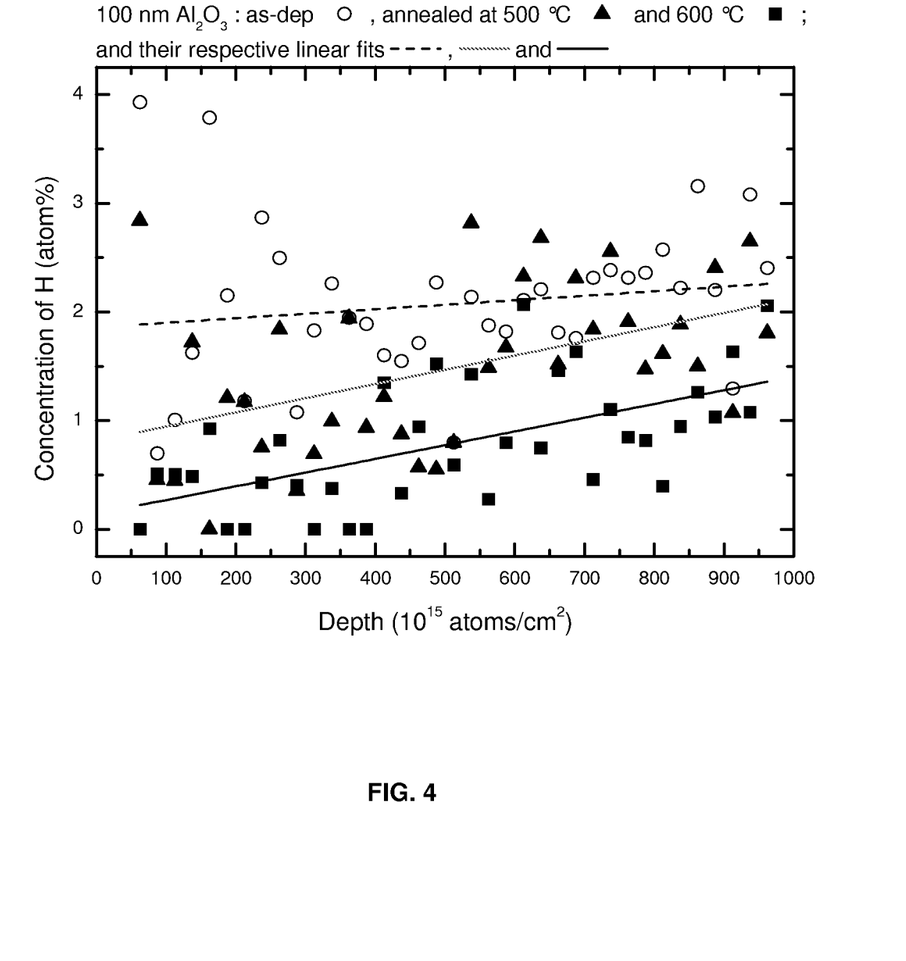
FIG. 4 shows the hydrogen concentration as a function of depth for a sample with an 100 nm thick as-deposited $Al_2O_3$ layer without blisters (diamonds), for a sample that was annealed at 500° C. after $Al_2O_3$ deposition (squares) and for a sample that was annealed at 600° C. after $Al_2O_3$ deposition (triangles).

FIG. 4 shows the hydrogen concentration as a function of depth for a sample with an 100 nm thick as-deposited $Al_2O_3$ layer without blisters (diamonds), for a sample that was annealed at 500° C. after $Al_2O_3$ deposition (squares) and for a sample that was annealed at 600° C. after $Al_2O_3$ deposition (triangles). In the graph shown in FIG. 4, a depth=0 corresponds to the $Al_2O_3$ surface and a depth=1000 corresponds to the $Si/Al_2O_3$ interface. In an as-deposited layer the hydrogen content is substantially uniform within the $Al_2O_3$ layer. After annealing there is a clear non-uniformity of the hydrogen content, with substantially more hydrogen remaining at the $Si/Al_2O_3$ interface as compared to the $Al_2O_3$ surface.

Figure 5:
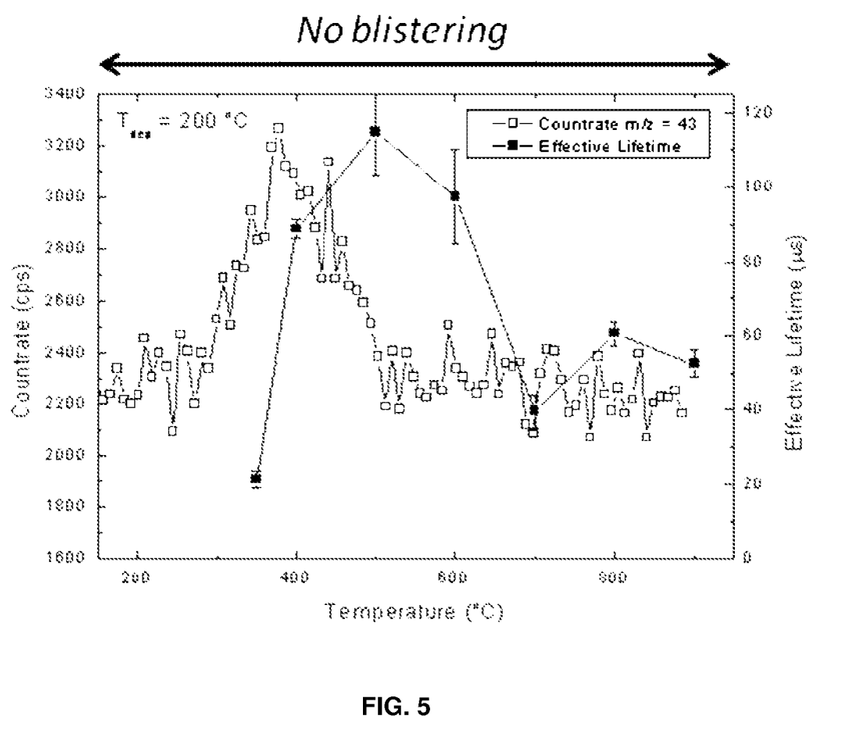
FIG. 5 shows temperature programmed desorption (TDS) data measured by APIMS at m/z=43 (open squares) and effective lifetimes (filled squares) for a Si sample with 5 nm $Al_2O_3$ deposited at 200° C., as a function of annealing temperature.

ALD $Al_2O_3$ layers with a thickness of 5 nm were grown on a silicon wafer at a deposition temperature of 200° C. After $Al_2O_3$ deposition the wafer was exposed to a continuously increasing temperature ranging from 180° C. to 900° C. FIG. 5 shows the measured desorption spectrum (open squares) for m/z=43. It can be seen that also here outgassing mainly occurs from a temperature of about 400° C. However, for this sample no blistering was observed for the full range of annealing temperatures. From these results it can be concluded that an about 5 nm thick Al2O3 layer is sufficiently thin to allow outgassing, without blister formation. This is opposed to the results shown in FIG. 3 for a 30 nm thick $Al_2O_3$ layer, where outgassing leads to blister formation. FIG. 5 also shows the measured effective lifetime (full squares) for samples annealed at different temperatures. The highest lifetime was measured for an annealing temperature of about 500° C. At higher annealing temperatures the effective lifetime decreases, but the decrease in lifetime is much less than for the sample having a 30 nm thick $Al_2O_3$ layer (FIG. 3).

Figure 7:
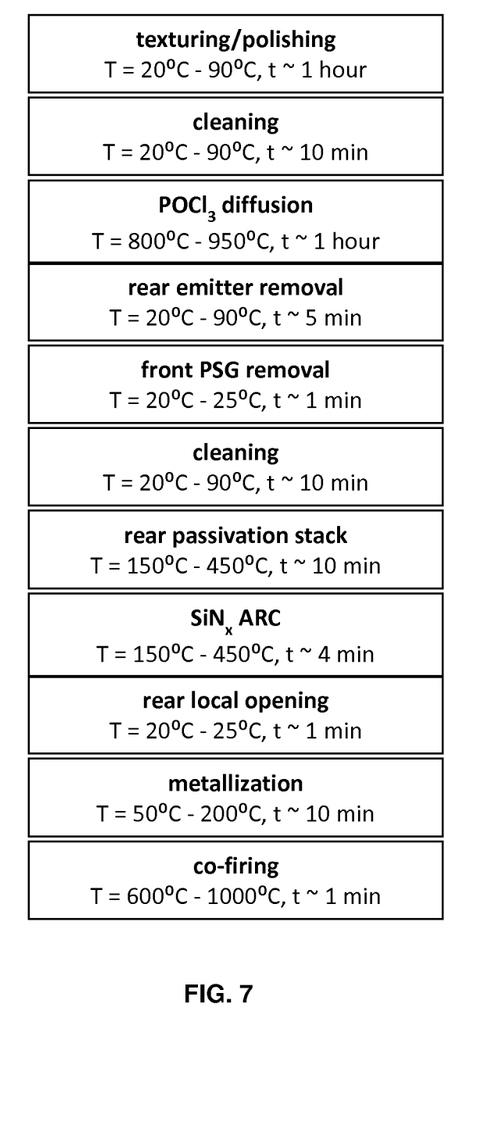
FIG. 7 illustrates a typical prior art PERC-type photovoltaic cell processing method.

An example of a prior art PERC-type silicon cell processing method is depicted in FIG. 7. It comprises: single side texturing of a substrate (e.g. silicon wafer); performing a cleaning step; emitter diffusion at a temperature in the range between 800° C. and 950° C. in a $POCl_3$ diffusion furnace, resulting in doped region both at the front side and at the rear side of the substrate; removal of the doped (emitter) region at the rear side; removal of the phosphosilicate glass (PSG) formed during emitter diffusion at the front surface; performing a cleaning step; providing a passivation stack at the rear side; depositing an ARC (antireflection coating), e.g. a SiNx ARC at the front side; local opening of the passivation stack at the rear side, for example by laser ablation; performing a rear side metallization step and a front side metallization step; and co-firing of the rear side metallization and the front side metallization at a temperature in the range between 600° C. and 1000° C.

In a method for fabricating PERC-type silicon cells with a rear side $Al_2O_3$ passivation layer, the $Al_2O_3$ layer at the rear side is capped with an additional dielectric layer such as a $SiN_x$ layer and/or a $SiO_x$ layer, the additional dielectric layer acting as a barrier for the Al metal layer during a contact firing process and providing a good rear internal reflection of long wavelength light (e.g. wavelengths larger than 900 nm). Such capping layer is typically deposited at a temperature at or above about 400° C., or above 400° C., or above 500° C. Thus, this capping layer deposition can act as an annealing process, leading to blister formation as illustrated above. In addition, providing the capping layer enlarges the layer thickness and thus the gas barrier thickness, leading to an even higher risk of blister formation. Also, in PERC-type cells, at the end of the fabrication process a metal cofiring process is typically performed at a temperature higher than about 835° C., again leading to blister formation problems. One embodiment provides a solution to the blister formation problem by using a thin $Al_2O_3$ layer (≤about 10 nm) and by performing an outgassing process at a temperature in the range between about 500° C. and 850° C. before capping of the $Al_2O_3$ layer.

PERC-type (passivated emitter and rear contacts) photovoltaic cells were fabricated, wherein a method according to one embodiment was used for rear surface passivation. As a substrate, 125 mm×125 mm semi-square p-type Cz silicon wafers with a resistivity of 0.5 to 3 Ohm-cm were used. After texturing of the substrate, the rear side of the substrate was polished, resulting in a substrate thickness of 160 micrometer. Next a front-side phosphorous diffusion process ($POCl_3$ diffusion) was performed for forming an emitter region having a sheet resistance of 60 Ohm per square. The wafers were then cleaned in a 1:4 $H_2O_2$:$H_2SO_4$ solution at 85° C. for 10 minutes, followed by an HF-dip (2% HF in deionized water) and hot air drying. Next a PECVD SiNx antireflection coating was deposited at the front side. Then the wafers were cleaned and dried using an advanced drying method. For a first part of the wafers, a cleaning method leading to a hydrophobic surface (Si—H) was used. More in particular, these wafers were cleaned in a 1:4 $H_2O_2$:$H_2SO_4$ solution at 85° C. for 10 minutes, followed by an HF-dip (2% HF in deionized water) and Marangoni drying. For a second part of the wafers, a cleaning method leading to a hydrophilic surface (Si—OH) was used. More in particular, these wafers were cleaned in a 1:4 $H_2O_2$:$H_2SO_4$ solution at 85° C. for 10 minutes, followed by an HF-dip (2% HF in deionized water), chemical oxidation in $NH_4OH$:$H_2O_2$:$H_2O$ (1:1:5) for 10 minutes at ambient temperature and finally Marangoni drying. A thin $Al_2O_3$ layer (thickness 5 nm or 10 nm) was then deposited on the rear surface using thermal ALD at 200° C., and an annealing process (outgassing process) in a nitrogen environment was done at three different temperatures (400° C., 500° C. and 600° C.). A PECVD $SiN_x$ capping layer was deposited on the $Al_2O_3$ layer. At the rear side of the cell contact openings were made through the $Al_2O_3$/$SiN_x$ stack using laser ablation. This was followed by Al sputtering at the rear side for forming rear side contacts and Ag screen printing at the front side for forming front side contacts, and co-firing of the metal contacts at 860° C. peak temperature.

Figure 6:
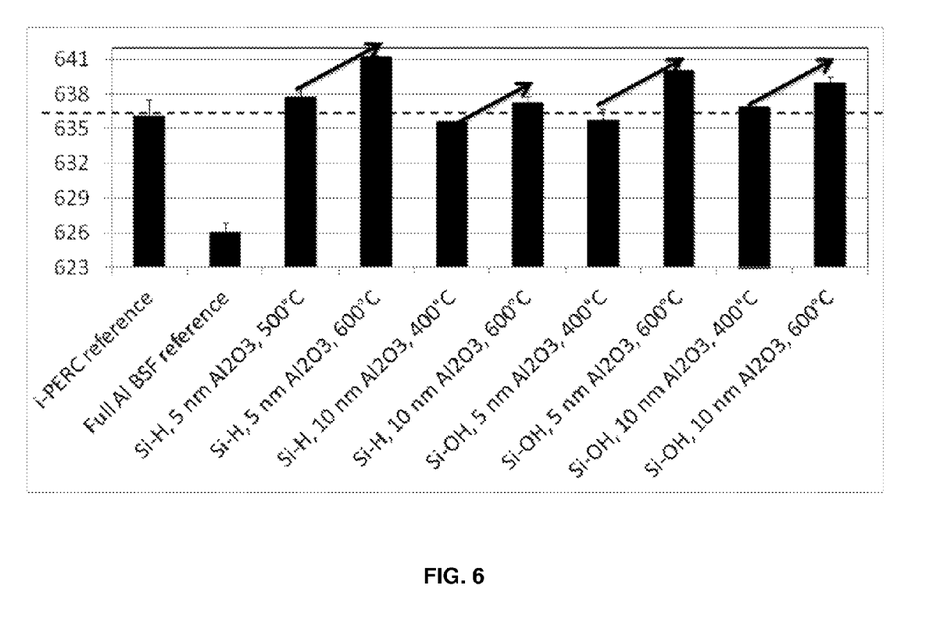
FIG. 6 shows measured $V_{oc}$ values of PERC-type photovoltaic cells for different process parameters of the $Al_2O_3$ based rear surface passivation layer, for a PERC reference cell and for a full Al BSF reference cell.

Measured open-circuit voltages for different cells are shown in FIG. 6. As a reference, also the open-circuit voltage of a cell with a full Al BSF (back surface field) is shown, as well as the open-circuit voltage of a PERC cell having a stack comprising a silicon oxide layer and a silicon nitride layer as a rear surface passivation stack. From these results, it can be concluded that the open-circuit voltage increases for increasing outgassing temperature, thus indicating a better surface passivation quality for increasing outgassing temperature. Outgassing at about 400° C. does not lead to a significant improvement as compared to the reference PERC cell. For the same outgassing conditions, higher open-circuit voltages are obtained for cells having an about 5 nm thick $Al_2O_3$ layer as compared to cells having an about 10 nm thick $Al_2O_3$ layer.

Figure 8:
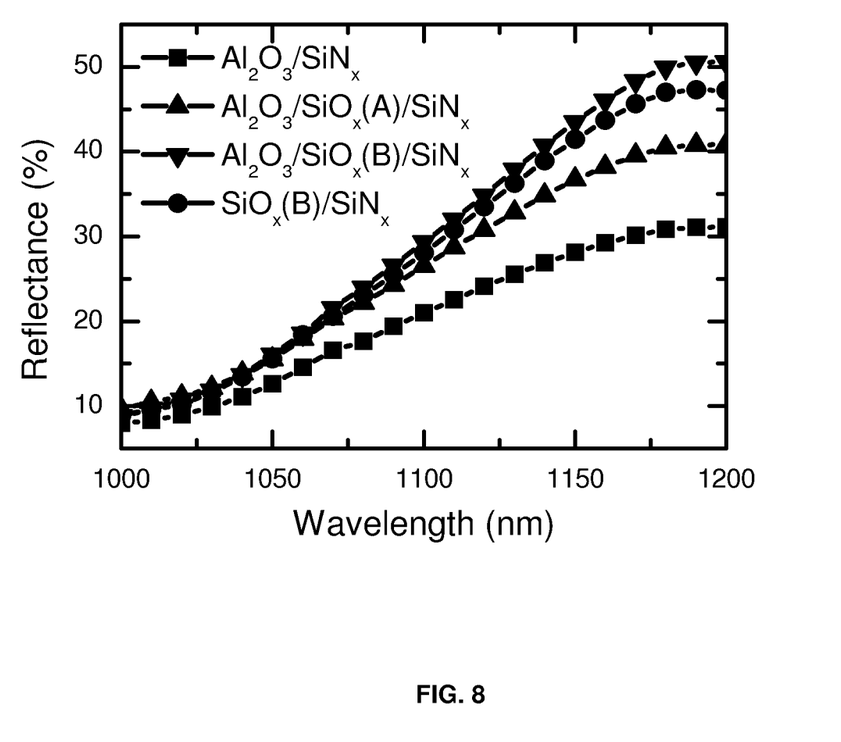
FIG. 8 is a graph illustrating reflectance at high wavelength for passivated emitter and rear cell-type cells for different rear surface passivation stacks.

FIG. 8 compares the rear internal reflectance at wavelengths between 1000 nm and 1200 nm of PERC-type solar cells on 150 micrometer thick p-type Cz Si substrates with alkaline-textured front surface and polished rear surface passivated by a stack of $Al_2O_3$/$SiN_x$, $SiO_x$/$SiN_x$ or $Al_2O_3$/$SiO_x$/$SiN_x$. For the $SiO_x$ layer, two thicknesses have been used, where $SiO_x$(A) is thinner as compared to $SiO_x$(B). From these reflectance measurements, it is clear that for optimal rear internal reflection of an $Al_2O_3$-based rear surface passivation, the $Al_2O_3$ layer may be capped with a thick-enough $SiO_x$/$SiN_x$ stack. This means that for optimal rear internal reflection, the $Al_2O_3$ is capped with $SiO_x$/$SiN_x$ before the co-firing step can be done (see also Table I). Capping a thin ALD $Al_2O_3$ film with $SiO_x$ and/or $SiN_x$ or annealing a stack of $Al_2O_3$ and $SiO_x$ and/or $SiN_x$ can lead to blister formation. Blistering is the partial delamination of the $Al_2O_3$-based stack caused by gaseous desorption in the $Al_2O_3$ layer upon thermal treatments above a critical temperature (typically 350° C. for ALD $Al_2O_3$). The capped $Al_2O_3$ layer acts as a gas barrier and blister formation occurs. Blistering of $Al_2O_3$ and capped $Al_2O_3$ layers has been observed for various deposition techniques: for thermal ALD, plasma enhanced ALD and PECVD. Using a thin enough (≤10 nm) $Al_2O_3$ layer and performing an annealing step prior to capping in accordance with one embodiment are shown to be a solution to create blister-free $Al_2O_3$-based passivation stacks.

In order to study the thermal stability of the $Al_2O_3$-based rear surface passivation stack, blister-free screen-printed large-area (148.25 cm²) p-type Si PERC-type solar cells were made as indicated in Table I, using an "outgassing" thermal treatment for 20 min in $N_2$ after the $Al_2O_3$ deposition (thickness 10 nm) and prior to the $SiO_x$/$SiN_x$ capping. 150 micrometer thick CZ substrates with a resistivity of 1 Ohm-cm were used.

TABLE I

Baseline p-type Cz Si passivated emitter and rear cell (PERC)-type solar cell process, with an ($Al_2O_3$)/SiOx/SiNx rear surface passivation stack. The 148.25-cm2 cells are 150-micrometer thick, have a base resistivity of 1Ωcm and a 60Ω/sq emitter.

Figure 9:
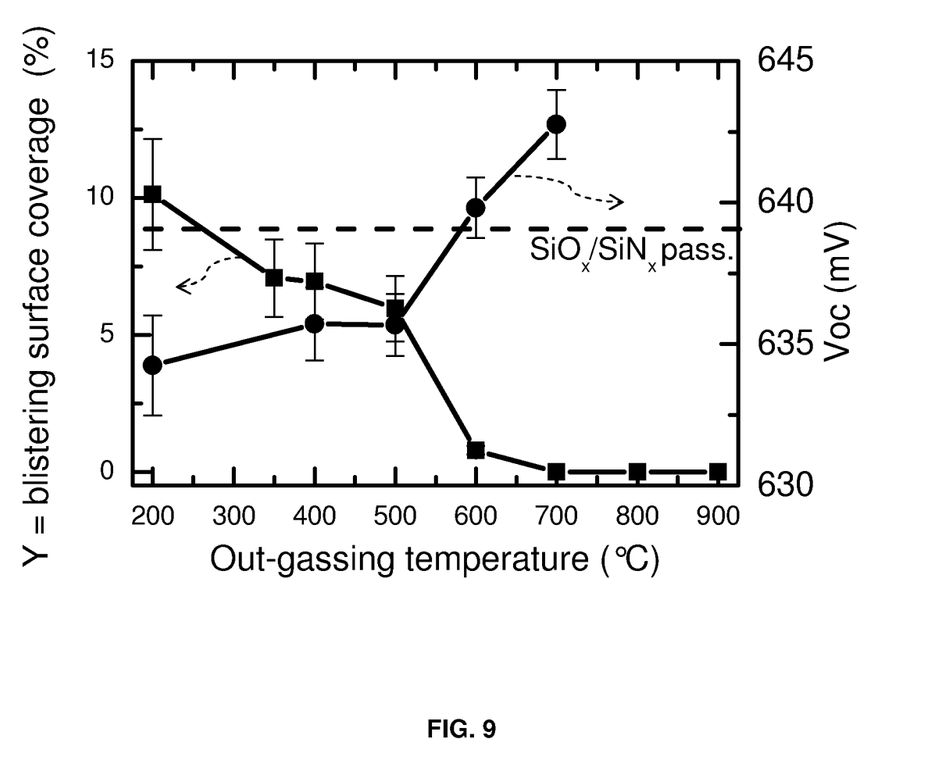
FIG. 9 is a graph showing the total blistered area and average $V_{OC}$ for passivated emitter and rear cell-type cells for different outgas sing temperatures.

Texturing/polishing
$POCl_3$ diffusion (60Ω/sq)
Rear side emitter removal
$SiN_x$ ARC front
Passivation rear ($Al_2O_3$)/$SiO_x$/$SiN_x$
Laser ablation rear
Physical vapor deposition Al rear/screen-printing Ag front
Co-firing FIG. 9 shows the open-circuit voltage $V_{OC}$ (filled circles) of these cells as a function of the out-gassing temperature. Also the blistering surface coverage Y (filled squares) for the $Al_2O_3$/$SiO_x$/$SiN_x$ stack is shown, as measured by optical microscopy. As a reference, the $V_{OC}$ of a $SiO_x$/$SiN_x$-passivated PERC cell is also given.

Figure 10:
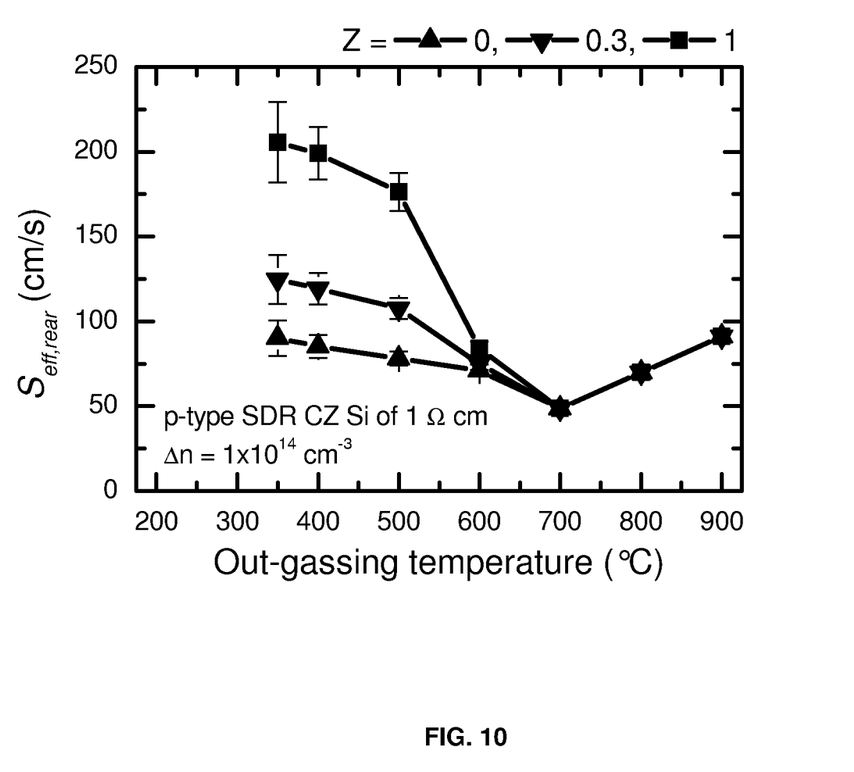
FIG. 10 is a graph showing $S_{eff,rear}$ as a function of outgassing temperature for passivated emitter and rear cell-type cells.
Figure 11:
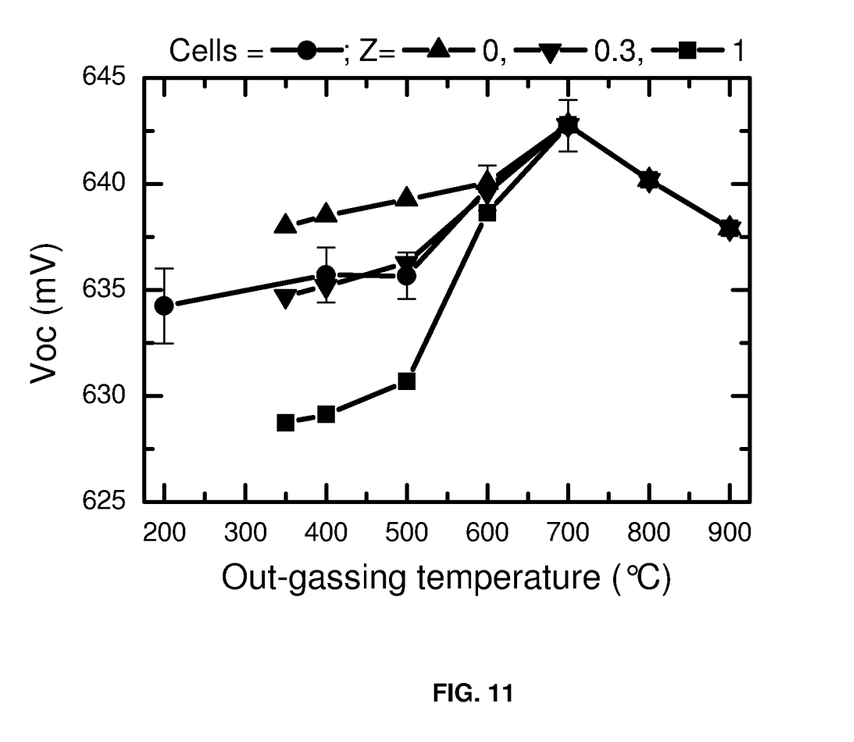
FIG. 11 is a graph showing the relation between simulated $V_{OC}$ and out-gas sing temperature for passivated emitter and rear cell-type cells.

FIG. 10 gives the calculated effective rear surface recombination velocity ($S_{eff,rear}$), with Z being the fraction of blistering contacted during co-firing, corresponding to the probability of forming undesired contacts through a blister during co-firing of the contacts. The $V_{OC}$ depicted in FIG. 11 is simulated from the $S_{eff,rear}$ values shown in FIG. 10. The filled circles in FIG. 11 show measured $V_{oc}$ values. The $S_{eff,rear}$ and $V_{OC}$ in FIGS. 10 and 11 are calculated as a function of out-gassing temperature as well.

As can be seen in FIG. 9, the average $V_{OC}$ of the $Al_2O_3$/$SiO_x$/$SiN_x$-passivated PERC-type cells clearly improves as a function of out-gassing temperature. Even more, after out-gassing at 600-700° C., the $Al_2O_3$/$SiO_x$/$SiN_x$ passivated cells are clearly better passivated at the rear compared with the $SiO_x$/$SiN_x$ passivated cells. Together with this improvement in $V_{OC}$, there is a decrease in blistering as a function of out-gassing temperature. By using this fraction of blistering Y and a factor Z for the probability of contacting through a blister during co-firing, an estimation of $S_{eff,rear}$ is obtained (FIG. 10). Simulating the expected $V_{OC}$ using this $S_{eff,rear}$, it is very clear that the increase in measured $V_{OC}$ as a function of out-gassing temperature is directly linked to the decrease in blistering. If the out-gassing temperature is too low during co-firing, about 30% of the blisters (corresponding to Z=0.3) become local point contacts; hence, the $S_{eff,rear}$ increases and consequently the $V_{OC}$ decreases. For out-gassing temperatures above 800° C., the $S_{eff,rear}$ starts to increase again.

Integration of $Al_2O_3$/$SiO_x$/$SiN_x$ as rear surface passivation for p-type Si PERC solar cells, in combination with an out-gassing step, has been shown to be advantageous. The average and best cell results for $Al_2O_3$/$SiO_x$/$SiN_x$ passivated PERC-type solar cells out-gassed at 700° C. after the $Al_2O_3$ deposition and prior to the $SiO_x$/$SiN_x$ deposition steps are listed in Table II. Also the best reference $SiO_x$/$SiN_x$-passivated PERC-type solar cell result is given in Table II.

TABLE II

Overview of cell characterization results (AM 1.5G) for 14/.25 cm2 Al2O3/SiOx/SiNx passivated p-type Cz Si PERC-type solar cells. The processing sequence is given in Table I. The cells are 150 micrometer thick and have a base resistivity of 1 Ohm-cm

| Rear surface passivation | | $J_{sc}$ [mA/cm2] | $V_{oc}$ [mV] | FF [%] | Efficiency [%] |
|---|---|---|---|---|---|
| $Al_2O_3$/$SiO_x$/$SiN_x$ | average (4 cells) | 38.0 ± 0.2 | 643 ± 1 | 77.6 ± 0.2 | 19.0 ± 0.1 |
| | best cell | 38.2 | 645 | 77.7 | 19.1 |
| $SiO_x$/$SiN_x$ | best cell | 37.8 | 638 | 77.7 | 18.7 |

Figure 12:
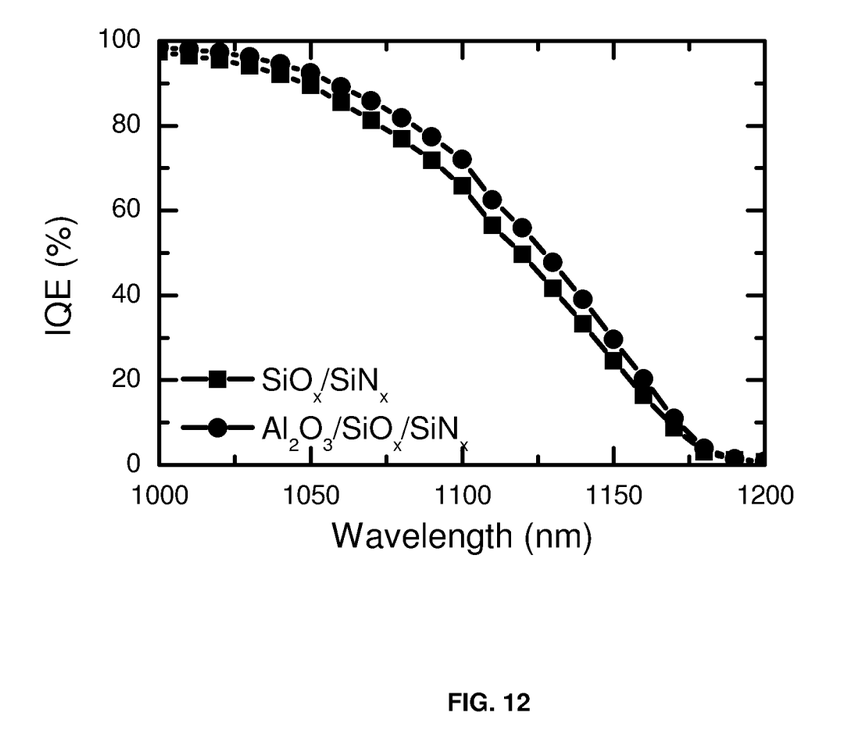
FIG. 12 is a graph showing the relation between Internal Quantum Efficiency (IQE) and wavelength at high wavelengths, for passivated emitter and rear cell-type cells, compared for different rear surface passivation stacks.

The internal quantum efficiency (IQE) at high wavelength is shown for both $SiO_x$/$SiN_x$ and $Al_2O_3$/$SiO_x$/$SiN_x$ passivated cells in FIG. 12. As seen in Table II, for $Al_2O_3$/$SiO_x$/$SiN_x$-passivated PERC-type solar cells, an optimum reaching an average cell efficiency of 19.0% is found, as compared with 18.7% for the best $SiO_x$/$SiN_x$-passivated solar cell. There is an obvious gain in $V_{OC}$ and $J_{SC}$, thanks to enhanced rear surface passivation and enhanced rear internal reflection. This improved $Al_2O_3$/$SiO_x$/$SiN_x$ rear surface passivation is confirmed by the IQE measurements at wavelengths between 1000 and 1200 nm as shown in FIG. 12.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the disclosure as applied to various embodiments, it will be understood that various omissions, substitutions, and changes in the form and details of the device or process illustrated may be made by those skilled in the technology.

What is claimed is:

1. A method of forming a surface passivation layer on a surface of a crystalline silicon substrate, the method comprising:
   depositing an $Al_2O_3$ layer on the surface, the $Al_2O_3$ layer having a thickness not exceeding about 15 nm;
   performing an outgassing process at a temperature in the range between about 500° C. and 900° C., after the deposition of the $Al_2O_3$ layer on the surface; and
   after the outgassing process, depositing at least one additional dielectric layer on the $Al_2O_3$ layer.

2. The method according to claim 1, wherein depositing the $Al_2O_3$ layer on the surface comprises depositing an $Al_2O_3$ layer having a thickness not exceeding about 10 nm.

3. The method according to claim 1, wherein the outgassing process is performed at a temperature between about 700° C. and 850° C.

4. The method according to claim 1, wherein the outgassing process is performed in a nitrogen environment.

5. The method according to claim 1, wherein the duration of the out-gassing process is between about 5 and 30 minutes.

6. The method according to claim 1, further comprising processing the crystalline silicon substrate further toward a silicon solar cell, at least partially comprising processing at temperatures in the range between about 400° C. and 900° C.

7. The method according to claim 6, wherein the crystalline silicon substrate is processed further toward a silicon solar cell at temperatures in the range between about 400° C. and 900° C.

8. The method according to claim 1, wherein the $Al_2O_3$ layer is deposited by atomic layer deposition at a temperature in the range between about 150° C. and 250° C.

9. The method according to claim 1, wherein the $Al_2O_3$ layer is deposited by plasma enhanced chemical vapor deposition at a temperature in the range between about 150° C. and 350° C.

10. The method according to claim 1, wherein the method is used for rear surface passivation of silicon photovoltaic cells, wherein a metal firing process is performed after depositing the $Al_2O_3$ layer and after capping the $Al_2O_3$ layer with at least one additional dielectric layer, the additional dielectric layer forming a barrier against metal spiking during firing and improving back reflectance for the silicon photovoltaic cell.

11. The method according to claim 10, wherein the metal firing process is performed at a temperature higher than about 835° C.

12. The method according to claim 1, further comprising cleaning the surface before depositing the $Al_2O_3$ layer on the surface, by a cleaning method leading to a hydrophilic surface.

13. The method according to claim 1, wherein the at least one additional dielectric layer comprises a silicon nitride layer and/or a silicon oxide layer.

14. A crystalline silicon substrate having a surface on which a surface passivation layer is formed by the method according to claim 1.

15. A method of forming a surface passivation layer on a surface of a crystalline silicon substrate, the method comprising:
- depositing an $Al_2O_3$ layer on the surface, the $Al_2O_3$ layer having a thickness not exceeding 15 nm;
- performing an outgassing process at a temperature in the range between 500° C. and 900° C.; and
- depositing a dielectric layer on the $Al_2O_3$ layer.

16. The method according to claim 15, wherein the dielectric layer comprises a silicon nitride layer and/or a silicon oxide layer.

17. A crystalline silicon substrate having a surface on which a surface passivation layer is formed by the method according to claim 15.

* * * * *